United States Patent
Jin et al.

(10) Patent No.: US 7,332,400 B2
(45) Date of Patent: Feb. 19, 2008

(54) METHOD OF MANUFACTURING A SEMICONDUCTOR DEVICE HAVING A GATE STRUCTURE WITH LOW PARASITIC CAPACITANCE

(75) Inventors: You-Seung Jin, Seoul (KR); Jong-Hyon Ahn, Gyeonggi-do (KR); Hyuk-Ju Ryu, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/313,631

(22) Filed: Dec. 21, 2005

(65) Prior Publication Data
US 2006/0099766 A1 May 11, 2006

Related U.S. Application Data

(62) Division of application No. 10/985,246, filed on Nov. 10, 2004, now Pat. No. 7,008,835.

(30) Foreign Application Priority Data
Nov. 24, 2003 (KR) .................................. 03-83783

(51) Int. Cl.
*H01L 21/336* (2006.01)
(52) U.S. Cl. .................. 438/303; 438/585; 438/592
(58) Field of Classification Search ............. 438/303, 438/592, 595
See application file for complete search history.

(56) References Cited

U.S. PATENT DOCUMENTS

| | | | | |
|---|---|---|---|---|
| 4,908,332 | A |  | 3/1990 | Wu ............................. 437/192 |
| 6,291,301 | B1 | * | 9/2001 | Chen ........................... 438/303 |
| 6,770,552 | B2 |  | 8/2004 | Wieczorek et al. .......... 438/592 |
| 2002/0110966 | A1 | * | 8/2002 | Lee ............................. 438/184 |
| 2006/0024873 | A1 | * | 2/2006 | Nandakumar et al. ....... 438/197 |

FOREIGN PATENT DOCUMENTS

| | | |
|---|---|---|
| JP | 2001-189451 | 7/2001 |
| KR | 93-701217 | 6/1993 |
| KR | 2001-0023858 | 3/2001 |
| KR | 2003-0056932 | 7/2003 |
| WO | 92/00792 | 1/1992 |
| WO | 99/12853 | 3/1999 |

* cited by examiner

*Primary Examiner*—Jack Chen
(74) *Attorney, Agent, or Firm*—Mills & Onello LLP

(57) ABSTRACT

In a method of manufacturing a semiconductor device, a gate insulation layer and a gate electrode are sequentially formed on a substrate on which an active region is defined. A planarized layer is formed on the substrate including the gate electrode. The planarized layer partially removed, and an upper portion of the gate electrode is exposed. A silicon epitaxial layer is selectively formed only on the exposed gate electrode, and the planarized layer is completely removed. A gate spacer is formed along side surfaces of the gate electrode and the silicon epitaxial layer. A source/drain region is formed on a surface portion of the active region corresponding to the gate electrode. Since the silicon epitaxial layer is formed only on the gate region except the source/drain region, the gate resistance is stabilized and the parasitic capacitance between the gate electrode and the source/drain region is reduce.

13 Claims, 5 Drawing Sheets

METHOD OF MANUFACTURING A SEMICONDUCTOR DEVICE HAVING A GATE STRUCTURE WITH LOW PARASITIC CAPACITANCE

CROSS-REFERENCE OF RELATED APPLICATIONS

This application is a divisional of U.S. application Ser. No. 10/985,246, filed Nov. 10, 2004 now U.S. Pat No. 7,008,835, which relies for priority upon Korean Patent Application No. 10-2003-0083783 filed on Nov. 24, 2003, the contents of which are herein incorporated by reference in their entirety.

BACKGROUND OF THE INVENTION

1. Field of the Invention

The present invention relates to a method of manufacturing a semiconductor device. More particularly, the present invention relates to a method of manufacturing a metal-oxide-semiconductor field effect transistor (MOS transistor) in which an epitaxial process is selectively carried out only on a gate region of the MOS transistor.

2. Description of the Related Art

As semiconductor memory devices are highly integrated and operate at a high speed, the size of an active region of a semiconductor substrate in which the semiconductor device is electrically active is reduced. Thus the length of the gate region of the MOS transistor is also decreased in the active region. As the gate region of the MOS transistor is shortened, the source or drain region has a significant effect on electrical field or voltage of a channel region in the MOS transistor, which is referred to as a short channel effect such as a reduction of threshold voltage in the MOS transistor. That is, as the gate region of the MOS transistor is shortened, channel size is greatly influenced by electrons of the depletion area. The channel size is also greatly influenced by the electrical field and voltage of the source/drain of the MOS transistor as well as by the gate voltage, which may cause the short channel effect such as the reduction of the threshold voltage.

In addition, as the drain voltage is increased, the depletion area of the drain region is increased in proportion thereto, and finally reaches the source region of the MOS transistor. Therefore, when the length of the gate region becomes short, the depletion areas of the source/drain regions are interconnected with each other. When the source depletion area is connected to the drain depletion area, the electrical field of the drain region reduces the voltage of the source region, thus an electrical current passes between the source and drain regions even though the channel is not formed therebetween, which is referred to as a punch through phenomenon. When the punch through phenomenon occurs, the drain current is not saturated, rather rapidly increased even in the saturation region.

In general, the deeper the junction depth of the source/drain regions is, the more the short channel effect is generated. Therefore, a parasitic resistance of the source/drain regions such as a sheet resistance or a contact resistance needs to be reduced while the junction depth of the source/drain regions shallows in order to prevent the short channel effect. A silicidation process is widely used for reducing a specific resistance of the gate electrode and a parasitic resistance of the source/drain regions. According to the silicidation process, the metal silicide layer is selectively coated on a surface of the gate electrode or of the source/drain regions.

However, the above recent trend of reducing the size of the gate electrode such as a thickness thereof causes various problems during the silicidation process. For example, the silicide layer is agglomerated along a grain boundary of the gate electrode, or the gate insulation layer and the active region are attacked by the silicide layer on the gate electrode in case of a small thickness of the gate electrode.

An elevated MOS transistor including an elevated source/drain structure has been introduced for obviating the above-described problems. In the elevated MOS transistor, the source/drain region is elevated and extends above the substrate by a silicon epitaxial layer coated thereon through a selective epitaxial growth (SEG) process. A method of manufacturing the elevated MOS transistor is disclosed in Korean Patent Laid Open Publication No. 2003-56932.

FIGS. 1A and 1B are schematic cross-sectional views illustrating the method of manufacturing a semiconductor device disclosed in the above Korean Patent Laid Open Publication.

Referring to FIG. 1A, a gate insulation layer 12 and a gate electrode 14 including polysilicon are sequentially coated on a substrate 10, and ions are lightly implanted on a surface portion of the substrate 10 adjacent to the gate electrode 14 to thereby form lightly doped source/drain region (not shown).

A first insulation layer including a silicon oxide layer and a second insulation layer including a silicon nitride layer are sequentially formed on a surface of the substrate 10 including the gate electrode 14. Then, the first and second insulation layers are anisotropically etched, so that a first insulation layer pattern 18 and a second insulation layer pattern 20 are formed along side surface of the gate electrode 14. For example, the first and second insulation layer patterns 18 and 20 are provided as a gate spacer 22.

Other ions are heavily implanted on a surface portion of the substrate 10 adjacent to the gate electrode 14 using the gate electrode 14 and the gate spacer 22 as an ion implantation mask to thereby form a heavily-doped source/drain region (not shown).

The silicon epitaxial layers 24a and 24b are grown on a top surface of both the gate electrode 14 and the source/drain regions.

Referring to FIG. 1B, the silicon epitaxial layers 24a and 24b are silicidated, and the gate silicide layer 26a and source/drain silicide layer 26b are formed on the gate electrode 14 and on the source/drain regions, respectively.

The elevated MOS transistor manufactured according to the above Korean Patent Laid Open Publication is advantageous in that both the gate electrode and the source/drain regions are elevated by the SEG process, and the electrical resistance of the gate electrode 14 and the source/drain regions is reduced by silicidation of the silicon epitaxial layer.

However, the elevated MOS transistor according to the above Korean Patent Laid Open Publication has some disadvantages. For example, since the elevated source/drain regions and the gate electrode 14 come into indirect contact with each other through the medium of the gate spacer 22, a parasitic capacitance A is generated between the gate electrode 14 and the elevated source/drain regions proportional to a dielectric constant of the gate spacer 22. The parasitic capacitance A degrades the capability of the transistor for controlling threshold voltage, thus causing unnecessary power consumption.

In addition, since the silicon epitaxial layer is grown along a predetermined direction on the silicon substrate 10, a thickness of a peripheral portion of the silicon epitaxial layer 24b adjacent to the first insulation layer pattern 18 is decreased, so that a facet is formed on the peripheral portion of the silicon epitaxial layer 24b. Accordingly, an implantation profile is distorted around the facet after the dopants are implanted onto the source/drain region on which the silicon epitaxial layer is already grown. The implantation profile is formed abnormally deep into the silicon substrate 10 around the first insulation layer pattern 18, thereby forming a distortion implantation profile, so that intensity of the electric field becomes very high at a portion of the silicon substrate 10 corresponding to the distortion implantation profile, and a leak current is generated from the silicon substrate 10.

SUMMARY OF THE INVENTION

Accordingly, the present invention provides a method of manufacturing a semiconductor device having a stable gate resistance and a low parasitic capacitance between a gate electrode and a source/drain electrode by selectively carrying out an epitaxial process only in a gate region.

According to an aspect of the present invention, there is provided a method of manufacturing a semiconductor device. A gate insulation layer and a gate electrode are sequentially formed on a substrate, and an active region is defined on the substrate. A planarized layer is formed on the substrate including the gate electrode, and a portion of the planarized layer is removed so that an upper portion of the gate electrode is exposed. A silicon epitaxial layer is selectively formed on the exposed gate electrode, and the remaining portion of the planarized layer is removed. A gate spacer is formed along side surfaces of the gate electrode and the silicon epitaxial layer, and source/drain regions are formed at surface portions of the active region corresponding to the gate electrode.

In one embodiment, the planarized layer comprises an SOG-based material. The planarized layer can have a thickness sufficient to cover the gate electrode.

In one embodiment, the planarized layer is partially removed by a chemical mechanical polishing process or a wet etching process. In one embodiment, the planarized layer is partially removed by both a chemical mechanical polishing process and a wet etching process. In one embodiment, the remaining portion of the planarized layer is removed by a chemical mechanical polishing process or a wet etching process. The thickness of the gate electrode can be maintained constant when the planarized layer is removed.

In one embodiment, lightly doped source/drain regions are formed by lightly implanting dopants through the surface portions of the active region at the side portion of the gate electrode before the planarized layer is formed.

In one embodiment, the gate spacer has at least one insulation layer.

In one embodiment, a silicide layer is formed on the silicon epitaxial layer and the source/drain regions after the source/drain regions are formed.

According to another aspect of the present invention, there is provided another method of manufacturing a semiconductor device. A gate insulation layer and a gate electrode are sequentially formed on a substrate, and an active region is defined on the substrate. A first gate spacer is formed along a side surface of the gate electrode. A planarized layer is formed on the substrate including the gate electrode and the first gate spacer. A portion of the planarized layer is removed, so that an upper portion of the gate electrode is exposed. A silicon epitaxial layer is selectively formed on the exposed gate electrode, and the remaining portion of the planarized layer is removed. A second gate spacer is formed along side surfaces of the silicon epitaxial layer and the first gate spacer. Source/drain regions are formed at surface portions of the active region corresponding to the gate electrode.

In one embodiment, the planarized layer comprises a SOG-based material. The planarized layer can have a thickness sufficient to cover the gate electrode.

The planarized layer can be partially removed by a chemical mechanical polishing process or a wet etching process. The planarized layer can be partially removed both by a chemical mechanical polishing process and a wet etching process. The remaining portion of the planarized layer can be fully removed by a chemical mechanical polishing process or a wet etching process.

In one embodiment, a thickness of the gate electrode is maintained to be constant when the planarized layer is removed.

Lightly doped source/drain regions can be formed by lightly implanting dopants through the surface portions of the active region at the side portion of the gate electrode before the planarized layer is formed.

In one embodiment, the first gate spacer includes a first insulation layer and a second insulation layer having a first etching selectivity with respect to the first insulation layer. The first insulation layer can comprise silicon oxide, and the second insulation layer can comprise silicon nitride. The second gate spacer can include a third insulation layer and a fourth insulation layer having a second etching selectivity with respect to the third insulation layer. The third insulation layer can comprise silicon oxide, and the fourth insulation layer can comprise silicon nitride.

A silicide layer can be formed on each of the silicon epitaxial layer and the source/drain region after the source/drain region is formed.

According to the present invention, the silicon epitaxial layer is formed only on the gate electrode except the source/drain regions. Accordingly, the upper portion of the gate electrode is enlarged, and the contact surface between the gate electrode and the metal silicide layer is also enlarged. Therefore, the gate resistance is reduced and an operating speed of the semiconductor device is increased. In addition, the parasitic capacitance between the gate electrode and the source/drain region is also reduced, thereby preventing current leakage.

BRIEF DESCRIPTION OF THE DRAWINGS

The foregoing and other features and advantages of the invention will be apparent from the more particular description of preferred embodiments of the invention, as illustrated in the accompanying drawings. The drawings are not necessarily to scale, emphasis instead being placed upon illustrating the principles of the invention. Like reference characters refer to like elements throughout the drawings.

DESCRIPTION OF THE EXEMPALRY EMBODIMENTS

Embodiment 1

FIGS. 2A to 2D are schematic cross-sectional views illustrating a method of manufacturing a semiconductor device according to a first embodiment of the present invention.

Figure 1A:
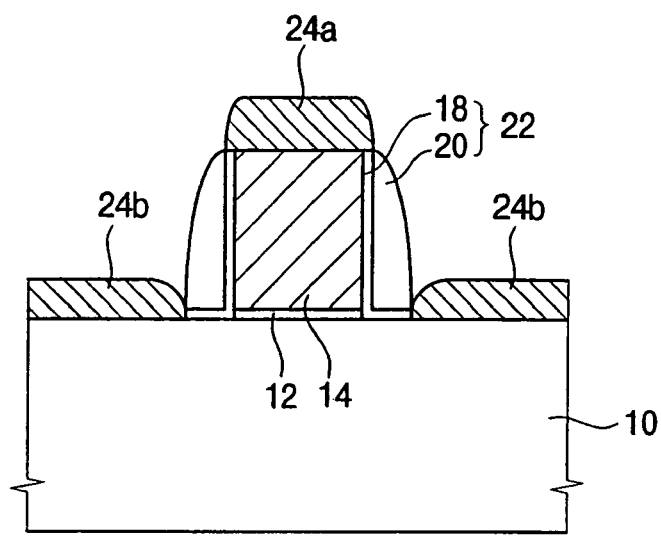
FIGS. 1A and 1B are schematic cross-sectional views illustrating a conventional method of manufacturing a semiconductor device.
Figure 1B:
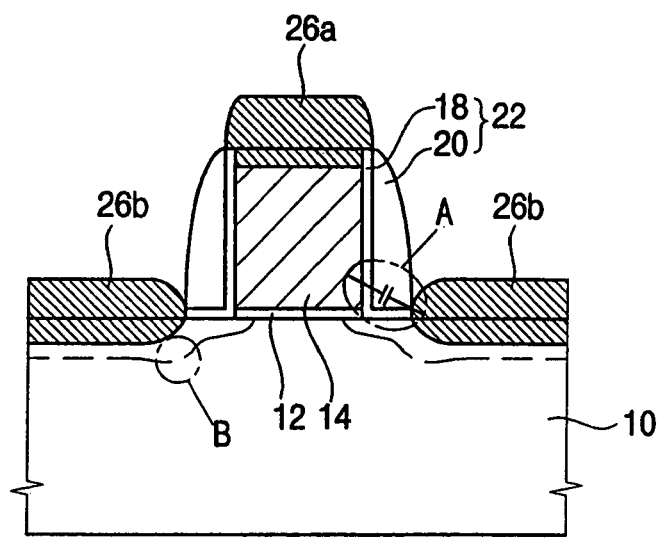
Figure 2A:
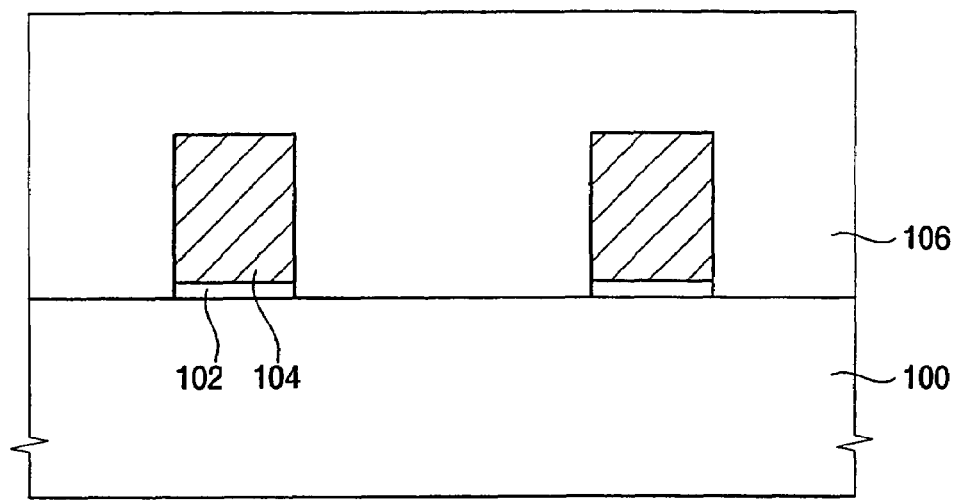
FIGS. 2A to 2D are schematic cross-sectional views illustrating a method of manufacturing a semiconductor device according to a first embodiment of the present invention.

FIG. 2A shows a planarized layer 106 formed on a semiconductor substrate 100.

Referring to FIG. 2A, an active region is defined on the semiconductor substrate 100 by a conventional device isolation process such as a local oxidation of silicon (LOCOS) process or a shallow trench isolation (STI) process. A gate insulation layer 102 is formed on the substrate 100 in the active region. For example, gate insulation layer 102 may include silicon oxide or silicon oxynitride. An ion implantation process may be carried out before the gate insulation layer 102 is formed so as to control threshold voltage of a MOS transistor.

A gate layer is stacked on the gate insulation layer 102, and doped with $N^+$ type material by various doping processes such as a POCl3 diffusion process, an ion implantation process and an in-situ doping process. In the present embodiment, polysilicon or silicon germanium (SiGe) is deposited on the gate insulation layer 102 to a thickness of about 500 Å to about 2000 Å, thereby forming the gate layer. Then, the gate layer is patterned via a photolithography process to form a gate electrode 104 in the active region.

Dopants are lightly implanted onto a surface portion of the active region corresponding to the gate electrode using the gate electrode 104 as an ion implantation mask, so that lightly doped source/drain (LDD) regions (not shown) are formed at the surface portions of the active region corresponding to the gate electrode.

A material having a high conformality (that is, having a good step coverage and reflowability) such as an SOG-based material (an SOG composition) is coated on the substrate 100 on which the gate electrode 104 is formed, thereby forming a planarized layer 106. In the present embodiment, the planarized layer 106 is formed to a thickness of about 2500 Å to about 4000 Å to sufficiently cover the gate electrode 104.

Figure 2B:
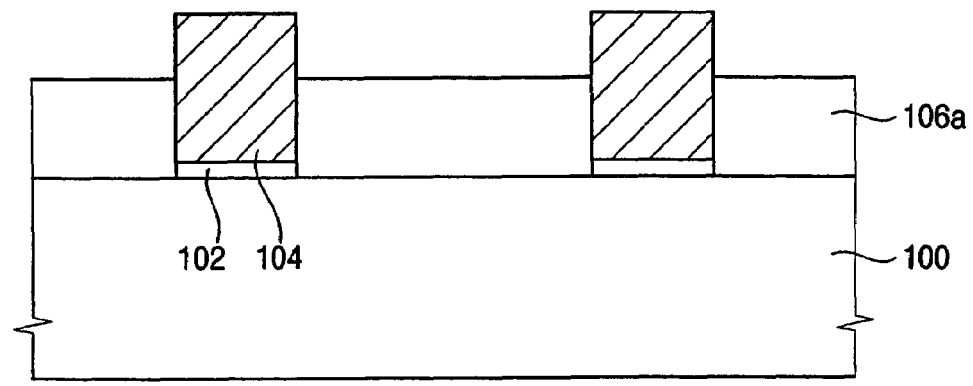

As shown in FIG. 2B, the gate electrode is partially exposed by partially removing the planarized layer 106. Referring to FIG. 2B, the planarized layer 106 is partially removed either by a chemical mechanical polishing (CMP) process or a wet etching process until an upper portion of the gate electrode 104 is exposed. The planarized layer 106 can also be partially removed both by the CMP process and the wet etching process.

In the present embodiment, some of the planarized layer 106 is first removed via the CMP process while the gate electrode 104 still completely underlies the planarized layer 106, and then partial removal of the planarized layer 106 is continued by a wet etching process until the upper portion of the gate electrode 104 is exposed. Accordingly, a remaining portion of the planarized layer 106 remains on the substrate 100 to a thickness of about 300 Å to about 1500 Å, which is hereinafter referred to as a remaining planarized layer 106a.

Figure 2C:
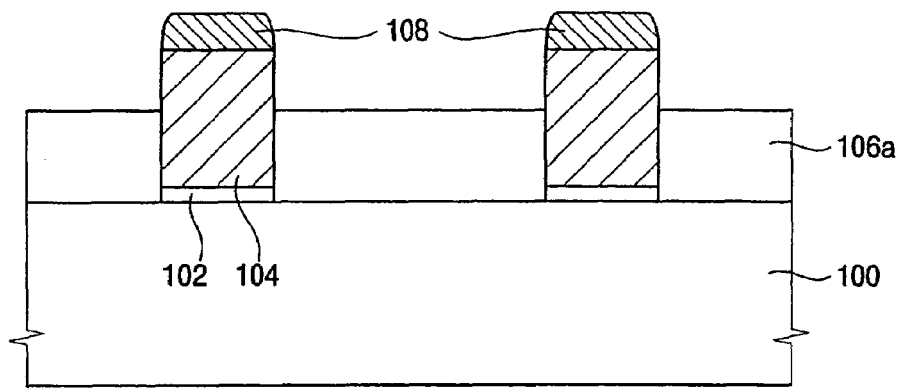

Referring to FIG. 2C, a silicon epitaxial layer 108 is formed on the gate electrode 104. After the upper portion of the gate electrode 104 is exposed by forming the remaining planrized layer 106a, a selective epitaxial growth (SEG) process is performed on the substrate 100 on which the gate electrode 104 has been formed using a silicon source gas such as $SiH_4$, $Si_2HCl_2$ and $Si_2H_2$. Accordingly, the silicon epitaxial layer 108 is formed only on a surface of the exposed gate electrode 104. In the present embodiment, the silicon epitaxial layer 108 functions as an extended gate electrode, and has a thickness greater than about 100 Å.

Figure 2D:
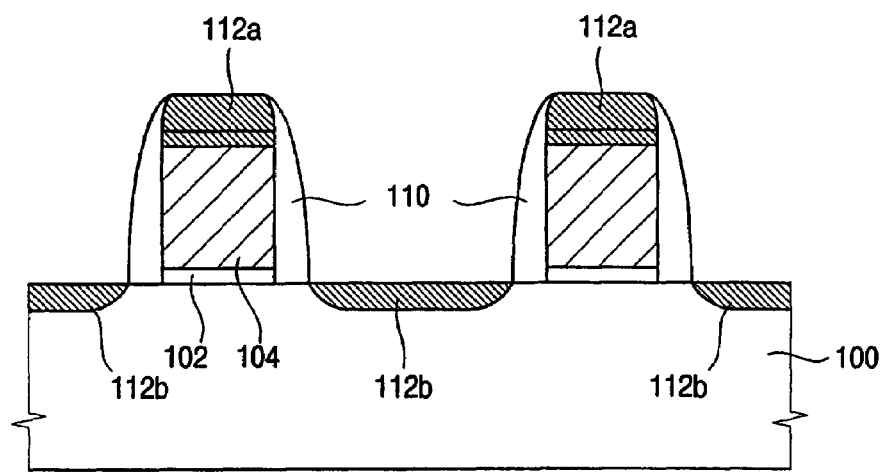

Referring to FIG. 2D, silicide layers 112a and 112b are formed on the gate electrode 104 and the source/drain regions, respectively. After the silicon epitaxial layer 108 is formed on the substrate 100, the remaining planarized layer 106a is completely removed from the substrate 100 by a dry or wet etching process.

An insulation layer is formed on the substrate 100 including the silicon epitaxial layer 108 on the exposed gate electrode 104, and the insulation layer is anisotropically etched away. As a result, a gate spacer 110 is formed along side surfaces of the gate electrode 104 and the silicon epitaxial layer 108. The gate spacer 110 may be a single layer such as a silicon nitride layer or a double layer including a first insulation layer and a second insulation layer having a predetermined etching selectivity with respect to the first insulation layer. For example, the first insulation layer may be a silicon oxide layer, and the second insulation layer may be a silicon nitride layer. When the gate spacer is a double layer including the silicon oxide layer and the silicon nitride layer, the silicon oxide layer functions as a buffer layer for alleviating stresses such as a mechanical or a thermal stress on the substrate 100 underlying the silicon oxide layer when the silicon nitride is deposited thereon.

Dopants are heavily implanted on a surface portion of the substrate 100 in the active region using the silicon epitaxial layer 108 and the gate spacer 110 as an ion implantation mask, so that heavily doped source/drain (HDD) regions (not shown) are formed at the surface portions of the active region corresponding to the gate electrode 104.

A wet cleaning process is performed to remove a native oxide layer or other particles on a surface of the silicon surface including the silicon epitaxial layer 108, and then a metal layer is formed on the substrate 100. The metal layer includes metal that reacts with silicon in the silicon epitaxial layer 108 and the substrate in the active region, thereby forming a metal silicide. Examples of the metal include nickel (Ni), cobalt (Co), titanium (Ti), etc.

A heat treatment is performed on the substrate 100 including the metal layer, and metal atoms of the metal layer are diffused into the silicon epitaxial layer 108 and the source/drain region. Accordingly, a gate silicide layer 112a and a source/drain silicide layer 112b such as $NiSi_2$, $CoSi_2$, and $TiSi_2$ are formed on the silicon epitaxial layer 108 and the source/drain regions, respectively, to a thickness greater than about 200 Å.

According to the present embodiment of the present invention, the silicon epitaxial layer 108 enlarges the upper portion of the gate electrode 104, thus the contact surface between the gate electrode 104 and the metal silicide layer 112a is also enlarged. Therefore, an electrical resistance of the gate electrode 104 is reduced, and the operating speed of the MOS transistor is increased.

In addition, the silicon epitaxial layer 108 is formed only on the gate region and not on the source/drain region. Thus, the source/drain region does not come into direct contact with the gate spacer 110. Therefore, the parasitic capacitance generated between the gate electrode and the source/drain region due to dielectric material of the gate spacer 110 is also reduced.

Furthermore, since the silicon epitaxial layer 108 is not formed on the substrate corresponding to the source/drain region in the active region, a leakage current that is caused by a distortion implantation profile and passes from the source/drain junction into the substrate 100 is sufficiently prevented.

Embodiment 2

Figure 3A:
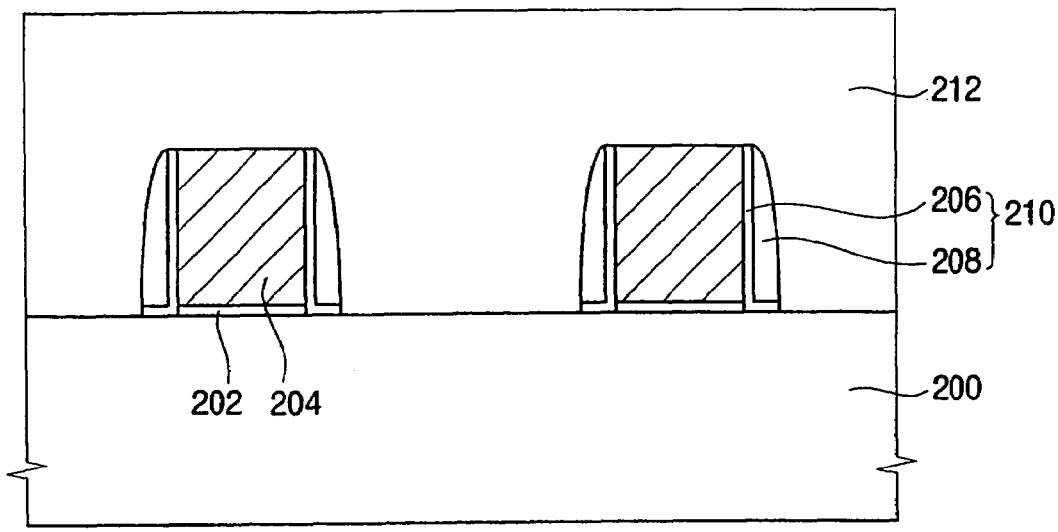
FIGS. 3A to 3C are schematic cross-sectional views illustrating a method of manufacturing a semiconductor device according to a second embodiment of the present invention.
Figure 3B:
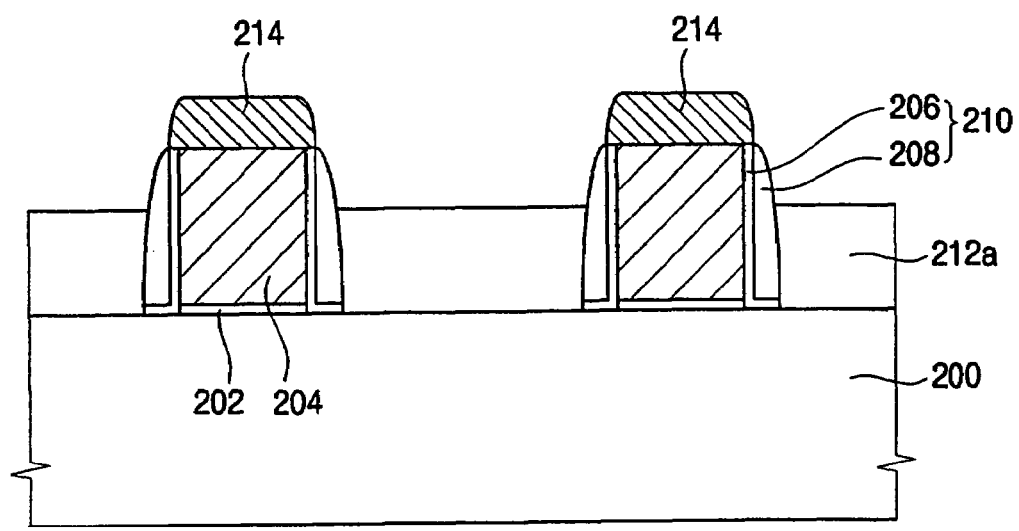
Figure 3C:
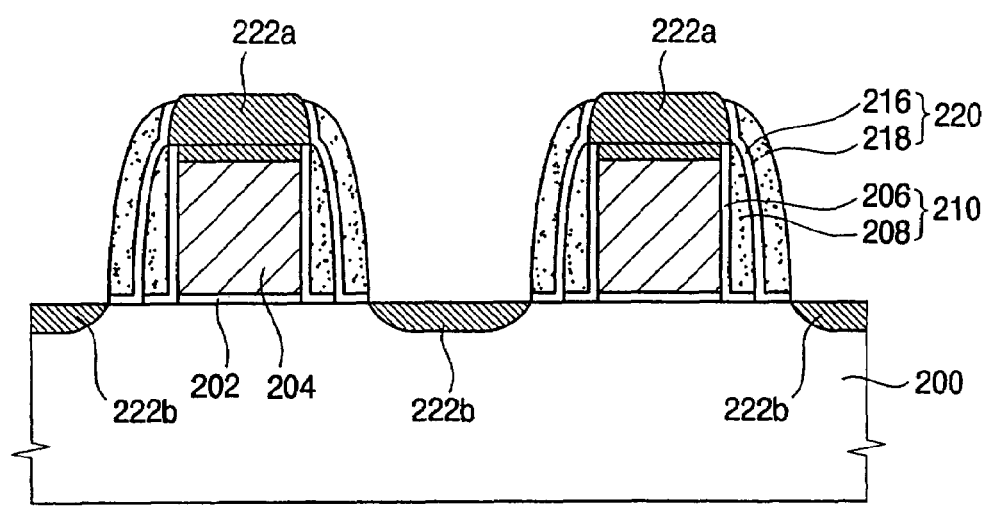

FIGS. 3A to 3C are schematic cross-sectional views illustrating a method of manufacturing a semiconductor device according to a second embodiment of the present invention.

FIG. 3A shows a planarized layer 212 formed on a semiconductor substrate 200.

Referring to FIG. 3A, an active region is defined on the semiconductor substrate 200 by a conventional device isolation process such as a local oxidation of silicon (LOCOS) process or a shallow trench isolation (STI) process. A gate insulation layer 202 is formed on the substrate 200 in the active region. For example, gate insulation layer 202 includes silicon oxide or silicon oxynitride. An ion implantation process may be carried out before the gate insulation layer 202 is formed so as to control the threshold voltage of a MOS transistor.

A gate layer is stacked on the gate insulation layer 202, and doped with N+ type by various doping processes such as a POCl3 diffusion process, an ion implantation process and an in-situ doping process. In the present embodiment, polysilicon or silicon germanium (SiGe) is deposited on the gate insulation layer 202 to a thickness of about 500 Å to about 2000 Å, thereby forming the gate layer. Subsequently, the gate layer is patterned by a photolithography process, and a gate electrode 204 is formed in the active region.

A first gate spacer 210 is formed along a side surface of the gate electrode 204. A first insulation layer such as a silicon oxide layer is formed on the substrate 200 on which the gate electrode 204 has been formed to a thickness of about 50 Å to about 100 Å. A second insulation layer such as a silicon nitride layer is formed on the first insulation layer to a thickness of about 100 Å to about 200 Å. The first and second insulation layers are anisotropically etched away, and as a result, the first gate spacer 210 including a first insulation layer pattern 206 and a second insulation layer pattern 208 is formed along side surface of the gate electrode 204.

The first gate spacer 210 determines an overlap distance between the gate electrode 204 and an LDD region during the subsequent ion implantation process, so that the first gate spacer 210 prevents the LDD region from excessively extending under the gate electrode 204, thus a short channel effect is prevented. The first insulation layer pattern 206 functions as a buffer layer for alleviating stresses such as a mechanical or thermal stress on the substrate 200 underlying the first insulation layer pattern 206 when the second insulation layer pattern 208 is formed thereon. In the present embodiment, the first insulation layer pattern 206 has a predetermined etching selectivity with respect to the second insulation layer pattern 208.

Dopants are lightly implanted onto a surface portion of the active region corresponding to the gate electrode using the gate electrode 204 and the first gate spacer 210 as an ion implantation mask, so that the LDD region (not shown) is formed on the surface portion of the active region corresponding to the gate electrode 204.

A material having high conformality such as an SOG-based material is coated on the substrate 200 on which the gate electrode 204 is formed, thereby forming a planarized layer 212. In the present embodiment, the planarized layer 212 is formed to have a thickness of about 2500 Å to about 4000 Å to sufficiently cover the gate electrode 204.

FIG. 3B shows a silicon epitaxial layer 214 formed on the gate electrode 204.

After forming the planarized layer 212 as described above, the planarized layer 212 is partially removed either by a chemical mechanical polishing (CMP) process or a wet etching process until an upper portion of the gate electrode 204 is exposed. The planarized layer 212 is also partially removed by the CMP process and the wet etching process.

In the present embodiment, the planarized layer 212 is partially removed by the CMP process while the gate electrode 204 still underlies the planarized layer 212, and the planarized layer 212 is then partially removed by the wet etching process until the upper portion of the gate electrode 204 is exposed. Accordingly, the planarized layer 212 remains on the substrate 200 to a thickness of about 300 Å to about 1500 Å, which is hereinafter referred to as a remaining planarized layer 212a.

A selective epitaxial growth (SEG) process is performed on the substrate 200 on which the gate electrode 204 has been formed using a silicon source gas such as $SiH_4$, $Si_2HCl_2$ and $Si_2H_2$. Accordingly, the silicon epitaxial layer 214 is formed only on a surface of the exposed gate electrode 204. In the present embodiment, the silicon epitaxial layer 214 functions as an extended gate electrode, and has a thickness greater than about 100 Å.

FIG. 3C shows silicide layers 222a and 222b formed on the gate electrode 204 and the source/drain region, respectively.

Referring to FIG. 3C, after the silicon epitaxial layer 214 is formed on the substrate 200, the remaining planarized layer 212a is completely removed from the substrate 200 by a dry or wet etching process.

A third insulation layer such as a silicon oxide layer is formed on the substrate 200 including the silicon epitaxial layer 214 on the exposed gate electrode 204 to a thickness of about 50 Å to about 100 Å, and a fourth insulation layer such as a silicon nitride layer is formed on the third insulation layer to a thickness of about 100 Å to about 200 Å. Subsequently, the third and fourth insulation layers are anisotropically etched away, thus a second gate spacer 220 is formed along side surfaces of the first gate spacer 210 and the silicon epitaxial layer 214. The second gate spacer 220 includes a third insulation layer 216 and a fourth insulation layer 218. The third insulation layer 216 functions as a buffer layer for alleviating stresses such as a mechanical or thermal stress on an underlying layer thereof when the fourth insulation layer 218 is deposited thereon, and has a predetermined etching selectivity with respect to the fourth insulation layer 218.

Dopants are heavily implanted on a surface portion of the substrate 200 in the active region using the silicon epitaxial layer 214 and the second gate spacer 220 as an ion implantation mask, so that heavily doped source/drain (HDD) regions (not shown) are formed on the surface portion of the active region corresponding to the gate electrode 204.

A wet cleaning process is performed to remove a native oxide layer or other particles on a surface of the silicon surface including the silicon epitaxial layer 214, and then a metal layer is formed on the substrate 200. The metal layer includes a metal that reacts with silicon in the silicon epitaxial layer and the substrate 200 in the active region, thereby forming a metal silicide. Examples of the metal include nickel (Ni), cobalt (Co), titanium (Ti), etc.

A heat treatment is performed on the substrate 200 including the metal layer, and metal atoms of the metal layer are diffused into the silicon epitaxial layer 214 and the source/drain region. Accordingly, a gate silicide layer 222a and a source/drain silicide layer 222b such as $NiSi_2$, $CoSi_2$, and $TiSi_2$ are formed on the silicon epitaxial layer 214 and the source/drain region, respectively, to a thickness greater than about 200 Å.

According to the present embodiment, the silicon epitaxial layer 214 enlarges the upper portion of the gate electrode 204, thus the gate electrode 204 has a T-shaped structure. Therefore, the contact surface between the gate electrode 204 and the metal silicide layer 222a is also enlarged, and as a result, an electrical resistance of the gate electrode 204 is reduced, and the operating speed of the MOS transistor is increased.

In addition, the silicon epitaxial layer 214 is formed just only on the gate region except the source/drain region, thus the source/drain region does not come into direct contact with the second gate spacer 210. Therefore, the parasitic capacitance generated between the gate electrode and the source/drain region due to dielectric material of the second gate spacer 210 is also reduced. The leakage current that is caused by distortion implantation profile and passes from the source/drain junction into the substrate 200 is also sufficiently prevented.

According to the above-described present invention, the planarized layer is formed on the substrate for sufficiently covering the gate electrode and the source/drain region of the active region. The planarized layer is partially removed until the upper portion of the gate electrode is exposed, and then the silicon epitaxial layer is formed just only on the surface of the exposed gate electrode by the SEG process.

Therefore, the upper portion of the gate electrode is enlarged by the silicon epitaxial layer, and as a result, the contact surface between the gate electrode and the metal silicide layer is also enlarged. Accordingly, an electrical resistance of the gate electrode is reduced, and the operating speed of the MOS transistor is increased.

In addition, since the silicon epitaxial layer is formed only on the gate region and not on the source/drain region, the source/drain region does not come into direct contact with the second gate spacer. Therefore, the parasitic capacitance generated between the gate electrode and the source/drain region due to dielectric material of the second gate spacer is also reduced.

Furthermore, since the silicon epitaxial layer is not formed on the substrate corresponding to the source/drain region in the active region, the leakage current that is caused by the distortion implantation profile and passes from the source/drain junction into the substrate is also sufficiently prevented.

Although the exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A method of manufacturing a semiconductor device, comprising:
   sequentially forming a gate insulation layer and a gate electrode on a substrate, an active region being defined on the substrate;
   forming a first gate spacer along a side surface of the gate electrode, wherein the first gate spacer includes a first insulation layer and a second insulation layer formed on the first insulation layer;
   forming a planarized layer on the substrate including the gate electrode and the first gate spacer;
   removing a first portion of the planarized layer, so that an upper portion of the gate electrode is exposed;
   selectively forming a silicon epitaxial layer on the exposed upper portion of the gate electrode, wherein a side surface of the silicon epitaxial layer is substantially aligned with an upper side surface of the first insulation layer;
   removing a remaining portion of the planarized layer;
   forming a second gate spacer along side surfaces of the silicon epitaxial layer and the first gate spacer; and
   forming a source/drain region on a surface portion of the active region corresponding to the gate electrode.

2. The method of claim 1, wherein the planarized layer comprises a SOG-based material.

3. The method of claim 1, wherein the planarized layer has a thickness sufficient to cover the gate electrode.

4. The method of claim 1, wherein the first portion of the planarized layer is removed by a chemical mechanical polishing process or a wet etching process.

5. The method of claim 1, wherein the first portion of the planarized layer is removed both by a chemical mechanical polishing process and a wet etching process.

6. The method of claim 1, wherein the remaining portion of the planarized layer is removed by a dry etching process or a wet etching process.

7. The method of claim 1, wherein a thickness of the gate electrode is maintained constant when the first portion and the remaining portion of the planarized layer are removed.

8. The method of claim 1, further comprising forming lightly doped source/drain regions by lightly implanting dopants through the surface portions of the active region at a side portion of the gate electrode before the planarized layer is formed.

9. The method of claim 1, wherein the second insulation layer having a first etching selectivity with respect to the first insulation layer.

10. The method of claim 9, wherein the first insulation layer comprises silicon oxide, and the second insulation layer comprises silicon nitride.

11. The method of claim 1, wherein the second gate spacer includes a third insulation layer and a fourth insulation layer having a second etching selectivity with respect to the third insulation layer.

12. The method of claim 11, wherein the third insulation layer comprises silicon oxide, and the fourth insulation layer comprises silicon nitride.

13. The method of claim 1, further comprising forming a silicide layer on each of the silicon epitaxial layer and the source/drain region after the source/drain region is formed.

* * * * *